(12) United States Patent
Wei et al.

(10) Patent No.: US 7,153,759 B2
(45) Date of Patent: Dec. 26, 2006

(54) METHOD OF FABRICATING MICROELECTROMECHANICAL SYSTEM STRUCTURES

(75) Inventors: Jun Wei, Singapore (SG); Stephen Chee Khuen Wong, Singapore (SG); Yongling Wu, Singapore (SG); Fern Lan Ng, Singapore (SG)

(73) Assignee: Agency for Science Technology and Research, Singapore (SG)

( * ) Notice: Subject to any disclaimer, the term of this patent is extended or adjusted under 35 U.S.C. 154(b) by 147 days.

(21) Appl. No.: 10/827,945

(22) Filed: Apr. 20, 2004

(65) Prior Publication Data

US 2005/0233543 A1  Oct. 20, 2005

(51) Int. Cl.
*H01L 21/30* (2006.01)
*H01L 21/46* (2006.01)
*H01L 21/326* (2006.01)
*H01L 21/479* (2006.01)

(52) U.S. Cl. ............. 438/455; 438/466; 438/470; 438/406

(58) Field of Classification Search ........... 438/455, 438/406, 466, 470
See application file for complete search history.

(56) References Cited

U.S. PATENT DOCUMENTS

| | | | | |
|---|---|---|---|---|
| 4,883,215 A | 11/1989 | Goesele et al. | ............. | 228/116 |
| 4,978,410 A | 12/1990 | Clark et al. | ................. | 156/325 |
| 5,318,652 A | 6/1994 | Hocker et al. | ........... | 156/273.9 |
| 5,346,848 A | 9/1994 | Grupen-Shemansky et al. | ............... | 437/61 |
| 5,407,856 A | 4/1995 | Quenzer et al. | ............. | 437/61 |
| 5,413,955 A | 5/1995 | Lee et al. | ...................... | 437/86 |
| 5,492,596 A * | 2/1996 | Cho | .............................. | 438/50 |
| 5,516,388 A | 5/1996 | Moran et al. | ................ | 156/89 |
| 5,695,590 A | 12/1997 | Wilcox et al. | ........... | 156/272.2 |
| 5,728,624 A | 3/1998 | Linn et al. | ................... | 438/459 |
| 5,820,648 A | 10/1998 | Akaike et al. | ................ | 65/36 |
| 5,866,469 A | 2/1999 | Hays | ........................ | 438/456 |
| 5,938,911 A | 8/1999 | Quenzer et al. | ............ | 205/114 |
| 5,946,601 A | 8/1999 | Wong et al. | ................ | 438/783 |
| 5,989,372 A | 11/1999 | Momoda et al. | ......... | 156/89.11 |
| 6,008,113 A | 12/1999 | Ismail et al. | ............... | 438/615 |
| 6,100,587 A | 8/2000 | Merchant et al. | .......... | 257/751 |
| 6,136,680 A | 10/2000 | Lai et al. | .................... | 438/597 |
| 6,159,824 A | 12/2000 | Henley et al. | .............. | 438/455 |
| 6,180,496 B1 | 1/2001 | Farrens et al. | ............. | 438/455 |
| 6,391,673 B1 | 5/2002 | Ha et al. | ...................... | 438/51 |
| 6,610,582 B1 * | 8/2003 | Stewart | ...................... | 438/455 |

FOREIGN PATENT DOCUMENTS

| | | |
|---|---|---|
| JP | 61-145839 | 7/1986 |
| JP | 62-265728 | 11/1987 |
| JP | 63-111652 | 5/1988 |
| JP | 2000121468 | 4/2000 |
| WO | WO 01/29890 A2 | 4/2001 |
| WO | WO 03/097552 A1 | 11/2003 |

* cited by examiner

*Primary Examiner*—Luan Thai
(74) *Attorney, Agent, or Firm*—Saile Ackerman LLC; Stephen B. Ackerman; Stephen G. Stanton

(57) ABSTRACT

A method of simultaneously bonding components, comprising the following steps. At least first, second and third components are provided and comprise: at least one glass component; and at least one conductive or semiconductive material component. The order of stacking of the components is determined to establish interfaces between the adjacent components. A hydrogen-free amorphous film is applied to one of the component surfaces at each interface comprising an adjacent: glass component; and conductive or semiconductive component. A sol gel with or without alkaline ions film is applied to one of the component surfaces at each interface comprising an adjacent: conductive or semiconductive component; and conductive or semiconductive component. The components are simultaneously anodically bonded in the determined order of stacking.

33 Claims, 8 Drawing Sheets

First Embodiment

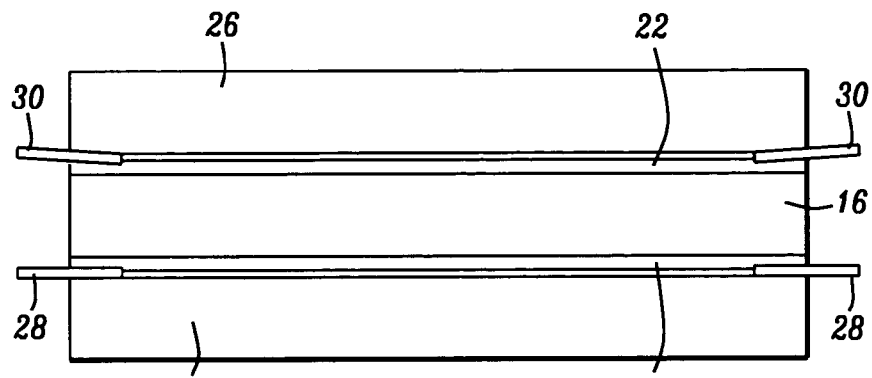
FIG. 5
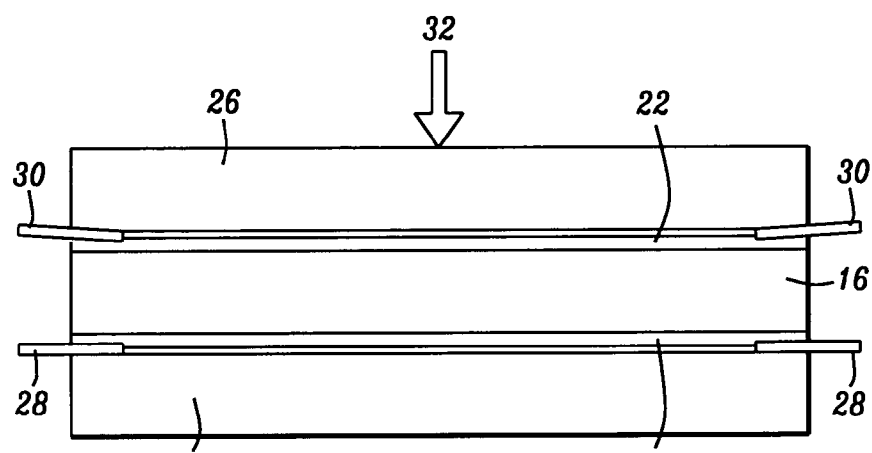
FIG. 6
FIG. 7
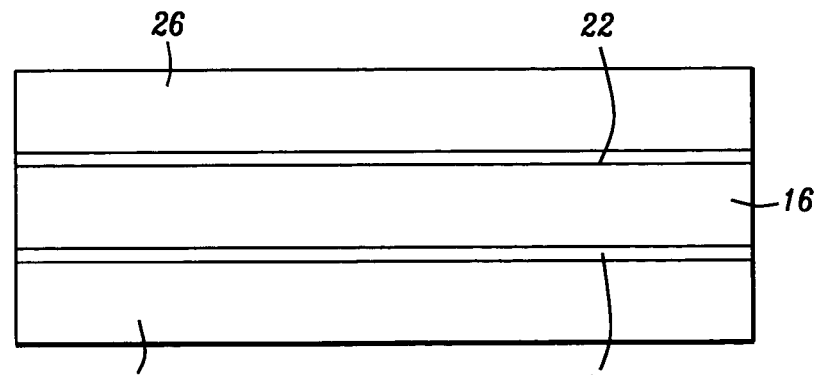
FIG. 8

Second Embodiment

*Third Embodiment*

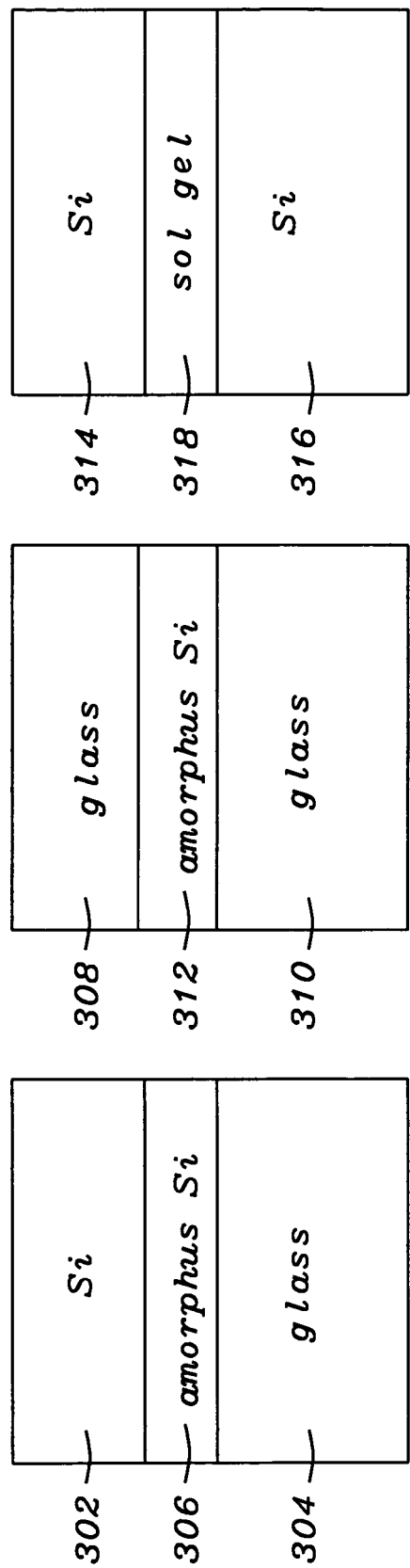

METHOD OF FABRICATING MICROELECTROMECHANICAL SYSTEM STRUCTURES

FIELD OF THE INVENTION

The present invention relates generally to semiconductor fabrication and more specifically to multiple wafer/substrate bonding.

BACKGROUND OF THE INVENTION

Wafer bonding is a key technology for materials integration in microelectromechanical systems (MEMS), micro-optoelectromechanical systems (MOEMS), semiconductors, microelectronics, and optoelectronics. It is also widely used for vacuum packaging, hermetic sealing and encapsulation. Silicon and glass are two types of materials that are often used in these applications.

WO 01/29890 A2 to Bergstedt et al. describes a method of bonding at least a first member to a second Si member through anodic bonding.

WO 03/097552 A1 to Wei et al. describes a method of bonding two components by depositing an amorphous and non-hydrogenated intermediate layer on one of the components and arranging the components in spaced relationship with the intermediate layer therebetween.

U.S. Pat. No. 5,938,911 to Quenzer et al. describes a process for producing glass coatings for anodic bonding purposes.

U.S. Pat. No. 5,695,590 to Wilcox et al. describes an anodic bonding method between Pyrex glass layers or wafers for making a pressure sensor.

U.S. Pat. No. 5,820,648 to Akaike et al. describes an anodic bonding process between silicon (Si) and glass substrates.

U.S. Pat. No. 5,866,469 to Hays describes a process for protecting microelectronic and MEMS structures on a low conductivity substrate during anodic wafer bonding of a covering wafer.

U.S. Pat. No. 5,989,372 to Momoda describes an anodic bonding method between electrically conductive substrates.

U.S. Pat. No. 5,516,388 to Moran et al. describes a sol-gel bonding process for two preexisting elements by sintering.

U.S. Pat. No. 4,978,410 to Clark et al. describes a method of repairing defects in joined ceramic bodies and joining fired or unfired ceramic bodies by using a paste prepared by sol-gel method.

SUMMARY OF THE INVENTION

Accordingly, it is an object of one or more embodiments of the present invention to provide a method of anodically bonding multiple wafers and/or substrates simultaneously at temperatures less than about 300° C.

Other objects will appear hereinafter.

It has now been discovered that the above and other objects of one or more embodiments of the present invention may be accomplished in the following manner. Specifically, at least first, second and third components are provided with at least one of the first, second and third components being comprised of a glass substrate and at least one of the first, second and third components being comprised of a conductive or semiconductive material. Each of the at least first, second and third components having an upper and lower surface. The order of stacking of the at least first, second and third components is determined to establish interfaces between adjacent at least first, second and third components. A hydrogen-free amorphous film is applied to one of the component surfaces at each interface comprising an adjacent: glass component; and conductive or semiconductive component. A sol gel with or without alkaline ions film is applied to one of the component surfaces at each interface comprising an adjacent: conductive or semiconductive component; and conductive or semiconductive component. The least first, second and third components are simultaneously anodically bonding in the determined order of stacking.

BRIEF DESCRIPTION OF THE DRAWINGS

The present invention will be more clearly understood from the following description taken in conjunction with the accompanying drawings in which like reference numerals designate similar or corresponding elements, regions and portions and in which:

FIGS. 1 to 8 schematically illustrate a first preferred embodiment of the present invention.

FIGS. 27 to 29 schematically illustrate a summarization of the invention.

DETAILED DESCRIPTION OF THE PREFERRED EMBODIMENT

Figure 1:
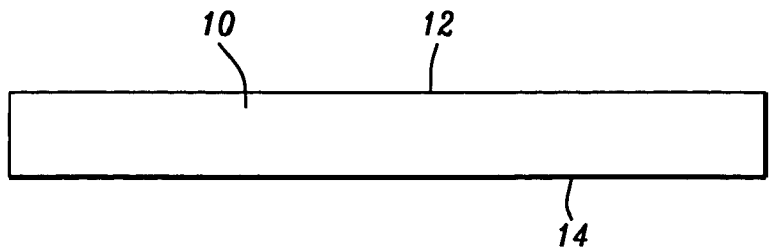

Information Known to the Inventors—Not to be Considered as Prior Art

The following information is known to the inventors and is not to be considered as prior art for the purposes of this invention.

Three commercially available technologies which will be discussed in turn are:

a) silicon fusion bonding;
b) intermediate layer bonding, including eutectic, glass frit, solder and adhesive bonding; and
c) anodic bonding.

Silicon Fusion Bonding

In silicon fusion bonding, high temperatures ranging between 700° C. and 1100° C. are required to achieve sufficient bond strength. Bonding of III–V compound semiconductors has been achieved at temperatures around 500° C. Wafer bonding at lower temperatures has also been reported, the bonding quality, such as bond strength and bubbles in the interface, is however not satisfactory for actual applications.

Intermediate Layer Bonding

In intermediate layer bonding, Au—Si eutectic bonding occurs at a process temperature of 500° C. which is higher than the Au—Si eutectic temperature of 363° C.

Screen printed frit bonding techniques have been used for bonding silicon-based devices. However, the bonding temperature is above 400° C. In addition, glass frits normally contain lead, which is not desirable for environmentally friendly applications.

Another current method for bonding substrates utilizes soldering and adhesive. Soldering and adhesive bonding can reduce the bonding temperature and have been employed for several applications. However, these technologies are limited by outgassing, low positioning accuracy, long-term reliability, bonding quality and other problems.

Anodic Bonding

Anodic bonding provides a hermetic and mechanically solid connection between glass and metal substrates or between glass and semiconductor substrates. Conventionally, the substrates are heated to a temperature of 400–450° C. with applied voltages of 400 volts to 1200 volts. Electrostatic forces and the migration of ions lead to an irreversible chemical bond at the boundary layer between the individual substrates.

For anodic bonding of silicon wafers or substrates, borosilicate glass intermediate layers can be used. The glass intermediate layers are conventionally produced by several coating techniques such as sputtering, vapor deposition, or coating with appropriate colloidal solutions. Sputtering and vapor deposition always involves the formation of thick coatings inside the apparatus, which must be removed from time to time, leading to frequent servicing and cleaning operations.

Problems Known to the Inventors—Not to be Considered Prior Art

The following are problems known to the inventors and are not to be considered as prior art for the purposes of the present invention.

For current bonding techniques, the wafers/substrates are bonded at high temperatures which lead to residual stresses due to the differences in the thermal expansion coefficients of the substrates, damage of the metal electrodes on the substrates, as well as limited materials in the bonding stack. However, high temperature normally yields high bonding strength.

For low temperature bonding, the work reported so far is limited to only bonding two elements, either glass to conductor anodic bonding or conductor to conductor bonding. When multilayer bonding is required, the bonding process is often done sequentially.

Present Invention

The thrust of one or more embodiments of the present invention is to provide a process of anodically bonding multiple wafers and/or substrates simultaneously at low temperatures, i.e. preferably from about 400 to 200° C. and more preferably less than about 300° C., and ensuring good bonding quality. Each individual process step is simple and easy to apply with the current processing principles. The invented process can be carried out at low cost.

Bonding Processing Steps Applicable to Each Embodiment

The bonding processing steps of the invention are described below which may be related to the embodiments described hereafter.

Prior to deposition, the wafer surface is pre-treated in organic or inorganic solutions to achieve clean and hydrophilic surface property.

That is the wafers/substrates are pre-treated in the chemical cleaning/hydrophilic solutions, such as sulphuric- or hydrogen-peroxide-based RCA solutions or an organic solution at a temperature preferably between about 50 to 80° C. for preferably from about 5 to 10 minutes.

The chemical cleaning/hydrophilic solutions are then flushed employing deionized water, for example.

An amorphous and non-hydrogenated thin film is applied on the surface of a conductor or glass wafer/substrate.

The existence of hydrogen in the film is undesirable as it has a high affinity with oxygen. The chemical bond between oxygen and hydrogen will reduce the bonding quality between the conductors and/or glass wafers/substrates.

The amorphous film is preferably deposited by physical vapor deposition as will be used hereafter for purposes of illustration. Applicable amorphous films preferably include silicon, silicon oxide or silicon nitride.

The physical vapor deposition is achieved preferably by laser ablation, evaporation, ion beam deposition or sputtering. Prior to deposition, the wafer surface is ultrasonically cleaned.

The sol gel coating/film with or without alkaline ions is preferably achieved by spin-on, immersion or spraying.

The solution for the sol gel coating/film includes alkanol, organosol (methyltrimethoxysilane (MTMS), methyltrimethoxysilane (MTMS), methyltriethoxysilane (MTEOS), tetraethylorthosilicate (TEOS), phenyltrimethoxysilane (PhTMS), methacryloxypropyltrimethoxysilane (MEMO), (3-glycidoxypropyl)trimethoxysilane (GLYMO), 3-methoxypropyltrimethoxysilane (MeOPrTMS) and/or their mixtures), acid (such as acetic acid, hydrochloric acid or sulphuric acid), water and alkali salts (such as sodium, potassium or lithium).

The weight percentage for the solution for the sol gel coating/film are:

alkanol: preferably from about 20 to 80 wt. % and more preferably from about 30 to 50 wt. %;

organosol: preferably from about 20 to 80 wt. % and more preferably from about 30 to 50 wt. %;

acid: preferably from about 0.00001 to 0.1 wt. % and more preferably from about 0.0001 to 0.01 wt. %;

water: preferably from about 10 to 80 wt. % and more preferably from about 20 to 50 wt. %; and alkali salts: preferably from about 0 to 5 wt. % and more preferably from about 0 to 2 wt. %.

The thickness of the sol gel coating/film can be controlled by the deposition process or by using multiple depositions. Sol gel films used include methyltrimethoxysilane (MTMS), methyl triethoxysilane (MTEOS) or other sol solution with or without alkaline ions. The thickness of the films ranges from nanometers to micrometers, that is preferably from about 10 nm to 10 µm. and more preferably from about 10 to 100 nm.

The coated wafers/substrates with sol gel coating/film are then dried or tempered at temperatures ranging from room temperature to temperatures below or equal to the bonding temperature, i.e. preferably from about 25 to 400° C.

Prior to bonding, the wafer surface is pre-treated in organic or inorganic solutions to achieve hydrophilic surface property.

That is the wafers/substrates are pre-treated in the chemical cleaning/hydrophilic solutions, such as sulphuric- or hydrogen-peroxide-based RCA solutions or an organic solution at a temperature preferably between about 50 to 80° C. for preferably from about 5 to 10 minutes.

The chemical cleaning/hydrophilic solutions are then flushed employing deionized water, for example.

The multiple wafers are then stacked horizontally on top of each other with the to-be bonded surfaces facing each other with high alignment accuracy. In order to avoid wafer contact during vacuuming, the wafers are separated by spacers placed at the wafer edges. The spacers have a thickness of preferably from about 20 to 50 µm.

After stacking and alignment, the wafers are heated to temperatures preferably between 200° C. and 400° C. and more preferably less than about 300° C. in a vacuum chamber. When the desired temperature is reached, the spacers are pulled out radially so that the whole surfaces of the wafers come into contact. Anodic bonding process among the multiple wafers is then carried out at an applied voltage of preferably from 100 to 1000 volts.

The bond achieved in this manner is characterized with both high mechanical strength and good mechanical and chemical durability.

The reliable bonding at the low temperatures of this invention avoids degradation or damage of pre-fabricated devices and integrated circuitry. It also minimizes or eliminates bonding-induced residual stress after cooling and can also reduce the process cost.

First Embodiment—FIGS. 1 to 8

FIGS. 1 to 8 illustrate a first preferred embodiment of the present invention.

Conditioning of First Wafer 10—FIG. 1

As shown in FIG. 1, a first wafer 10, which may be a semiconductive wafer or a conductive wafer, is conditioned in a chemical cleaning solution bath comprised of preferably sulphuric- or hydrogen-peroxide-based RCA solutions at a temperature of preferably from about 50 to 80° C. for preferably from about 2 to 20 minutes. This causes the upper and lower surfaces 12, 14 of first wafer 10 to become hydrophilic.

Figure 2:
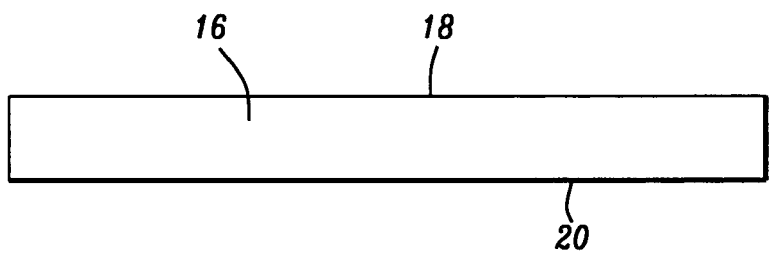

Conditioning of Second Wafer 16—FIG. 2

As shown in FIG. 2, a second wafer 16, such as a semiconductor wafer or a conductor wafer, is polished on both its upper 18 and lower 20 surfaces so as to have mirror finishes.

Second wafer 16 is then cleaned with a cleaning solvent that is preferably a sulphuric- or hydrogen-peroxide-based RCA solution.

Figure 3:
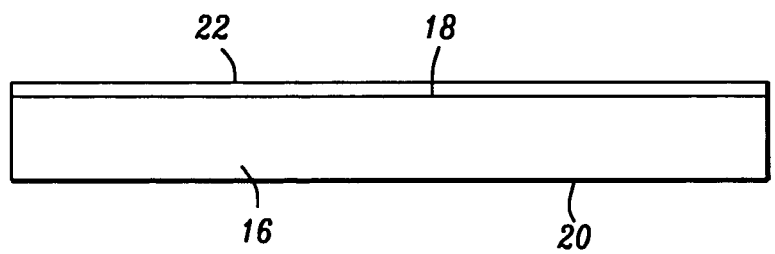

Formation of Amorphous Film 22 on Second Wafer 16—FIG. 3

As shown in FIG. 3, a hydrogen-free amorphous film 22 is formed on one polished surface 18 of second wafer 16 by physical vapor deposition (PVD) to a thickness of preferably from about 10 nm to 2 μm and more preferably from about 10 to 20 nm. During the PVD of amorphous film 22, neither hydrogen nor any hydrogen-containing gas is introduced.

The physical vapor deposition (PVD) of amorphous film 22 is achieved preferably by laser ablation, evaporation, ion beam deposition or sputtering.

Amorphous film 22 is preferably comprised of silicon, silicon oxide or silicon nitride.

Figure 4:
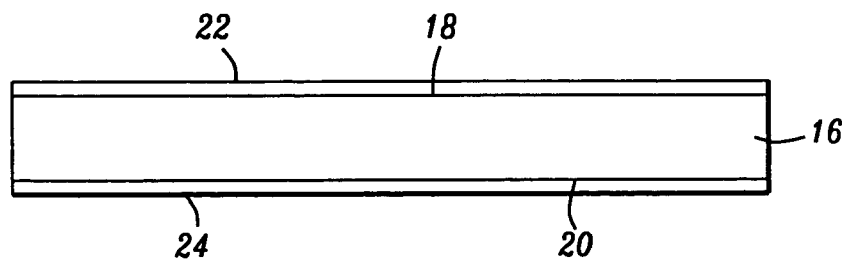

Formation of Sol Gel Film 24 on Second Wafer 16—FIG. 4

As shown in FIG. 4, the opposite surface 20 of second wafer 16 is cleaned using a cleansing solvent such as, preferably sulphuric- or hydrogen-peroxide-based RCA solutions.

A sol gel film 24 is then formed on the opposite side 20 of second wafer 16 to a thickness of preferably from about 10 nm to 10 μm and more preferably from about 10 to 100 nm.

Sol gel film 24 is applied preferably by spin-on, immersion or spraying.

The solution for the sol gel coating/film 24 includes alkanol, organosol (methyltrimethoxysilane (MTMS), methyltrimethoxysilane (MTMS), methyltriethoxysilane (MTEOS), tetraethylorthosilicate (TEOS), phenyltrimethoxysilane (PhTMS), methacryloxypropyltrimethoxysilane (MEMO), (3-glycidoxypropyl)trimethoxysilane (GLYMO), 3-methoxypropyltrimethoxysilane (MeOPrTMS) and/or their mixtures), acid (such as acetic acid, hydrochloric acid or sulphuric acid), water and alkali salts (such as sodium, potassium or lithium).

The weight percentage for the solution for the sol gel coating/film are:

alkanol: preferably from about 20 to 80 wt. % and more preferably from about 30 to 50 wt. %;

organosol: preferably from about 20 to 80 wt.(?)% and more preferably from about 30 to 50 wt. %;

acid: preferably from about 0.00001 to 0.1 wt. % and more preferably from about 0.0001 to 0.01 wt. %;

water: preferably from about 10 to 80 wt. % and more preferably from about 20 to 50 wt. %; and alkali salts: preferably from about 0 to 5 wt. % and more preferably from about 0 to 2 wt. %.

The sol gel coating/film 24 on second wafer 16 is then dried or tempered at temperatures ranging from room temperature to temperatures below or equal to the bonding temperature, i.e. preferably from about 25 to 400° C.

The amorphous film 22 and sol gel coating/film 24 on second wafer 16 are then conditioned using a chemical cleaning solution bath comprised of preferably sulphuric- or hydrogen-peroxide-based RCA solutions at a temperature of preferably from about 50 to 80° C. for preferably from about 2 to 20 minutes. This causes the upper and lower surfaces of second wafer 16 to become hydrophilic.

Conditioning of Third (Glass) Wafer 26—FIG. 5

As shown in FIG. 5, third wafer 26, that is preferably glass or glass with alkaline ions, is conditioned using a chemical cleaning solution bath comprised of preferably sulphuric- or hydrogen-peroxide-based RCA solutions at a temperature of preferably from about 50 to 80° C. for preferably from about 2 to 20 minutes.

Stacking of First, Second and Third Wafers 10, 16, 26 With Spacers 28, 30—FIG. 6

As shown in FIG. 6, second wafer 16 is positioned on top of, and spaced apart from, first wafer 10 using spacers 28 with the sol gel film 24 coated surface 20 facing first wafer 10.

Third wafer 26 is positioned on top of, and spaced apart from, second wafer 16 using spacers 30 with the PVD hydrogen-free amorphous film 22 coated surface 18 facing third wafer 26.

Spacers 28, 30 are placed at the edges of first, second and third wafers 10, 16, 26, respectively, once the first, second and third wafers 10, 16, 26 are properly aligned. Spacers 28, 30 have a thickness of preferably from about 20 to 50 μm.

After stacking and alignment, the wafers are heated to temperatures preferably between 200° C. and 400° C. and more preferably less than about 300° C. in a vacuum chamber.

Bringing First, Second and Third Wafers 10, 16, 26 into Point Contact—FIG. 7

As shown in FIG. 7, the first, second and third wafers 10, 16, 26 are brought into contact in their respective central areas under pressure 32 of preferably from about 0.001 to 100 N/m$^2$.

The spacers 28, 30 are then removed (see FIG. 8).

Simultaneous Anodic Bonding of First, Second and Third Wafers 10, 16, 26—FIG. 8

As shown in FIG. 8, with the spacers 28, 30 removed, the first, second and third wafers 10, 16, 26 are simultaneously anodically bonded at a temperature of preferably from about 200 to 400° C. and more preferably less than about 300° C. at voltages of preferably from about 100 to 1000 volts.

Second Embodiment—FIGS. 9 to 16

FIGS. 9 to 16 illustrate a second preferred embodiment of the present invention.

Figure 9:
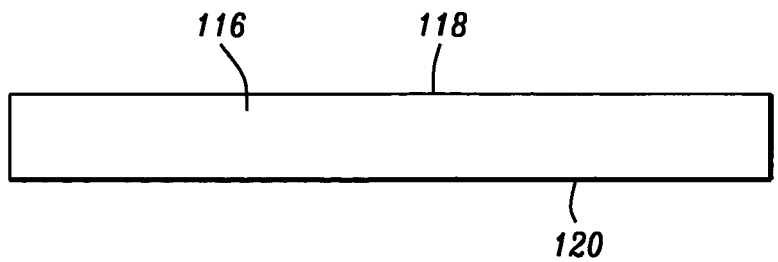
FIGS. 9 to 16 schematically illustrate a second preferred embodiment of the present invention.

Conditioning of First Wafer 116—FIG. 9

As shown in FIG. 9, a first wafer 116, such as a semiconductor wafer or a conductor wafer, is polished on both its upper 118 and lower 120 surfaces so as to have mirror finishes.

First wafer 116 is then cleaned with a cleaning solvent that is preferably sulphuric- or hydrogen-peroxide-based RCA solutions.

Figure 10:
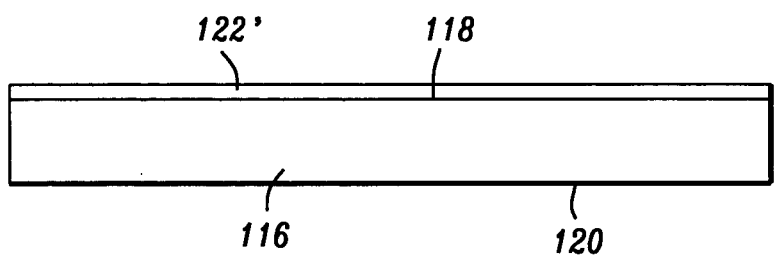

Formation of Amorphous Film 122' on First Wafer 116—FIG. 10

As shown in FIG. 10, a hydrogen-free amorphous film 122' is formed on one polished surface 118 of first wafer 116 by physical vapor deposition (PVD) in plasma to a thickness of preferably from about 10 nm to 2 µm and more preferably from about 10 to 100 nm. During the PVD of amorphous film 122', neither hydrogen nor any hydrogen-containing gas is introduced.

The physical vapor deposition (PVD) of amorphous film 122' is achieved preferably by laser ablation, evaporation, ion beam deposition or sputtering.

Amorphous film 122' is preferably comprised of silicon, silicon oxide or silicon nitride.

First wafer 116 with amorphous film 122' is then conditioned in a chemical cleaning solution bath comprised of preferably sulphuric- or hydrogen-peroxide-based RCA solutions at a temperature of preferably from about 50 to 80° C. for preferably from about 2 to 20 minutes.

Figure 11:
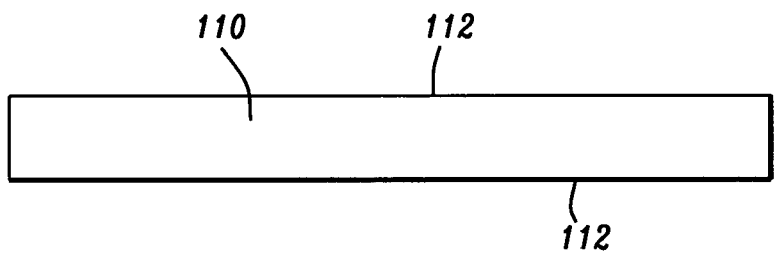

Conditioning of Second (Glass) Wafer 110—FIG. 11

As shown in FIG. 11, a second wafer 110 is polished on both its upper 112 and lower 114 surfaces so as to have mirror finishes. Second wafer 110 is preferably glass or glass with alkaline ions Second wafer 110 is then cleaned with a cleaning solvent that is preferably a sulphuric- or hydrogen-peroxide-based RCA solution.

Figure 12:
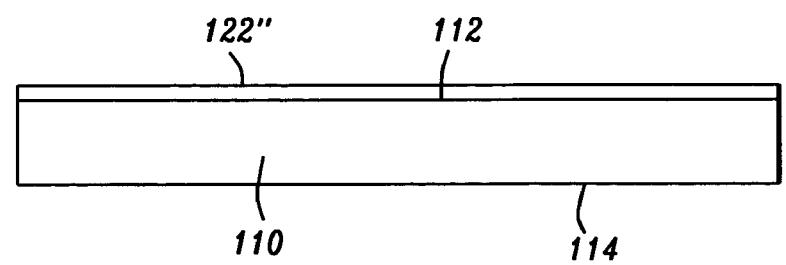

Formation of Amorphous Film 122" on Second Wafer 110—FIG. 12

As shown in FIG. 12, a hydrogen-free amorphous film 122" is formed on one polished surface 112 of second wafer 110 by physical vapor deposition (PVD) in plasma to a thickness of preferably from about 10 nm to 2 µm and more preferably from about 10 to 100 nm. During the PVD of amorphous film 122", neither hydrogen nor any hydrogen-containing gas is introduced.

The physical vapor deposition (PVD) of amorphous film 122" is achieved preferably by laser ablation, evaporation, ion beam deposition or sputtering.

Amorphous film 122" is preferably comprised of silicon, silicon oxide or silicon nitride.

Second wafer 110 with amorphous film 122" is then conditioned in a chemical cleaning solution bath comprised of preferably sulphuric- or hydrogen-peroxide-based RCA solutions at a temperature of preferably from about 50 to 80° C. for preferably from about 2 to 20 minutes.

Figure 13:
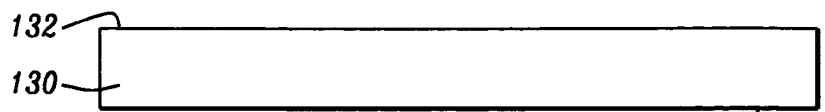

Conditioning of Third (Glass) Wafer 130—FIG. 13

As shown in FIG. 13, a third wafer 130 is conditioned in a chemical cleaning solution bath comprised of preferably sulphuric- or hydrogen-peroxide-based RCA solutions at a temperature of preferably from about 50 to 80° C. for preferably from about 2 to 20 minutes. This causes the upper and lower surfaces 132, 134 of third wafer 130 to become hydrophilic. Third wafer 130 is preferably glass or glass with alkaline ions.

Figure 14:
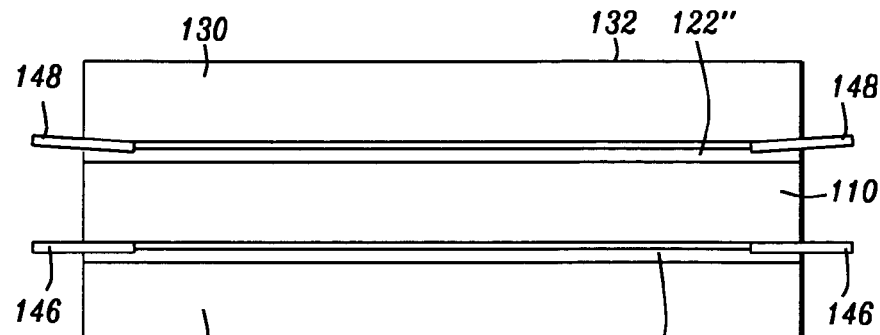

Stacking of First, Second and Third Wafers 116, 110, 130 With Spacers 146, 148—FIG. 14

As shown in FIG. 14, second wafer 110 is positioned on top of, and spaced apart from, first wafer 116 using spacers 146 with the PVD hydrogen-free amorphous film 122' coated surface 118 facing second wafer 110.

Third wafer 130 is positioned on top of, and spaced apart from, second wafer 110 using spacers 148 with the PVD hydrogen-free amorphous film 122" coated surface 112 facing third wafer 130.

Spacers 146, 148 are placed at the edges of first, second and third wafers 116, 110, 130, respectively, once the first, second and third wafers 116, 110, 130 are properly aligned. Spacers 146, 148 have a thickness of preferably from about 20 to 50 µm.

After stacking and alignment, the wafers are heated to temperatures preferably between 200° C. and 400° C. and more preferably less than about 300° C. in a vacuum chamber.

Figure 15:
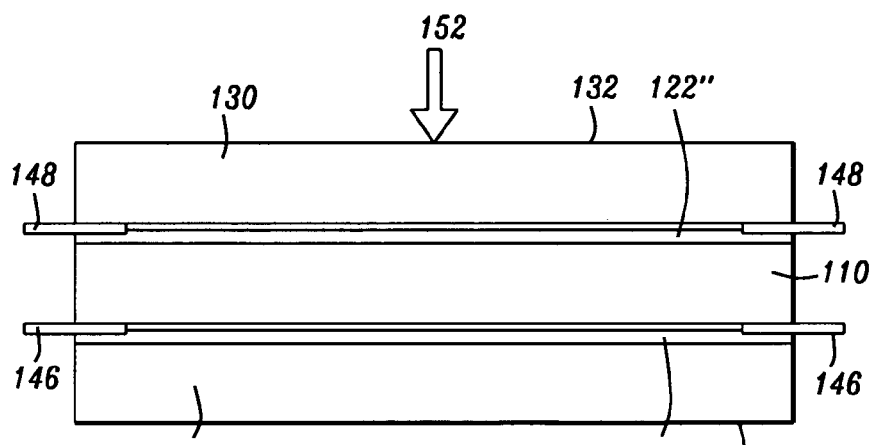

Bringing First, Second and Third Wafers 116, 110, 130 into Point Contact—FIG. 15

As shown in FIG. 15, the first, second and third wafers 116, 110, 130 are brought into contact in their respective central areas under pressure 152 of preferably from about 0.001 to 100 N/m².

Figure 16:
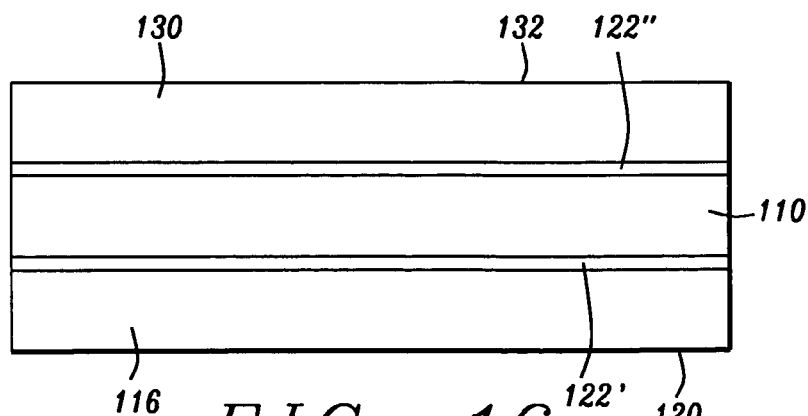

The spacers 146, 148 are then removed (see FIG. 16).

Simultaneous Anodic Bonding of First, Second and Third Wafers 116, 110, 130—FIG. 16

As shown in FIG. 16, with the spacers 146, 148 removed, the first, second and third wafers 116, 110, 130 are simultaneously anodically bonded at a temperature of preferably from about 200 to 400° C. and more preferably less than about 300° C. at voltages of preferably from about 100 to 1000 volts.

Third Embodiment—FIGS. 17 to 26

FIGS. 17 to 26 illustrate a third preferred embodiment of the present invention.

Figure 17:
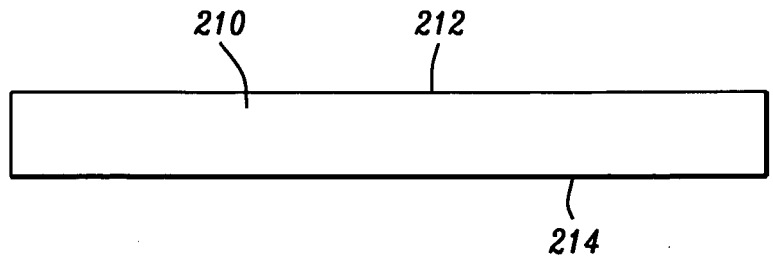
FIGS. 17 to 26 schematically illustrate a third preferred embodiment of the present invention.

Conditioning of First Wafer 210—FIG. 17

As shown in FIG. 17, a first wafer 210, such as a semiconductor wafer or a conductor wafer, is conditioned in a chemical cleaning solution bath comprised of preferably sulphuric- or hydrogen-peroxide-based RCA solutions at a temperature of preferably from about 50 to 80° C. for preferably from about 2 to 20 minutes. This causes the upper and lower surfaces 212, 214 of first wafer 210 to become hydrophilic.

Figure 18:
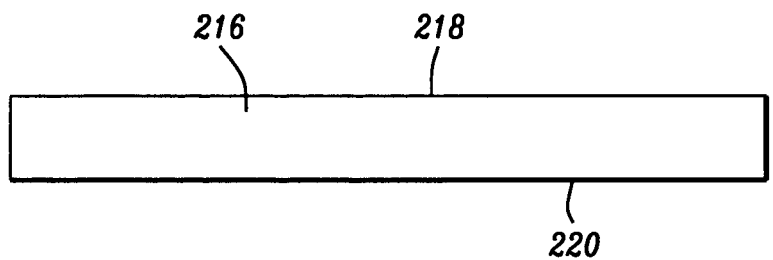

Conditioning of Second Wafer 216—FIG. 18

As shown in FIG. 18, a second wafer 216, such as a semiconductor wafer or a conductor wafer, is polished on both its upper 218 and lower 220 surfaces so as to have mirror finishes.

Second wafer 216 is then cleaned with a cleaning solvent that is preferably sulphuric- or hydrogen-peroxide-based RCA solutions.

Figure 19:
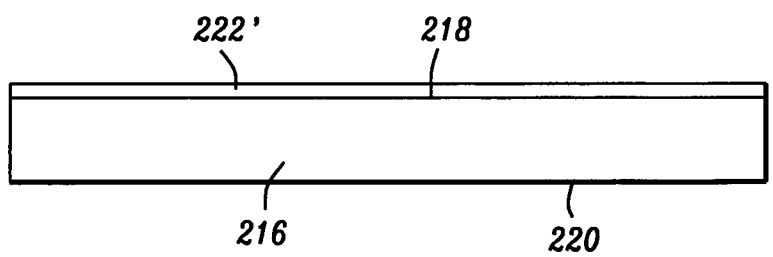

Formation of Amorphous Film 222' on Second Wafer 216—FIG. 19

As shown in FIG. 19, a hydrogen-free amorphous film 222' is formed on one polished surface 218 of second wafer 216 by physical vapor deposition (PVD) in plasma to a thickness of preferably from about 10 nm to 10 µm. and more preferably from about 10 to 100 nm. During the PVD of amorphous film 222', neither hydrogen nor any hydrogen-containing gas is introduced.

The physical vapor deposition (PVD) of amorphous film 222' is achieved preferably by laser ablation, evaporation, ion beam deposition or sputtering.

Amorphous film 222' is preferably comprised of silicon, silicon oxide or silicon nitride.

Figure 20:
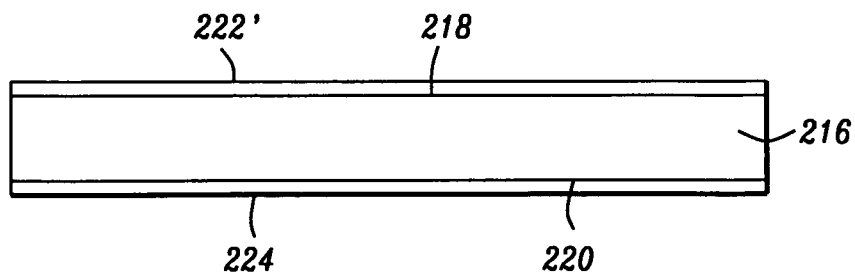

Formation of Sol Gel Film 224 on Second Wafer 216—FIG. 20

As shown in FIG. 20, the opposite surface 220 of second wafer 216 is cleaned using a cleansing solvent such as, preferably sulphuric- or hydrogen-peroxide-based RCA solutions.

A sol gel film 224 is then formed on the opposite side 220 of second wafer 216 to a thickness of preferably from about 10 nm to 10 μm. and more preferably from about 10 to 100 nm.

Sol gel film 224 is applied preferably by spin-on, immersion or spraying.

The solution for the sol gel coating/film 224 includes alkanol, organosol (methyltrimethoxysilane (MTMS), methyltrimethoxysilane (MTMS), methyltriethoxysilane (MTEOS), tetraethylorthosilicate (TEOS), phenyltrimethoxysilane (PhTMS), methacryloxypropyltrimethoxysilane (MEMO), (3-glycidoxypropyl)trimethoxysilane (GLYMO), 3-methoxypropyltrimethoxysilane (MeOPrTMS) and/or their mixtures), acid (such as acetic acid, hydrochloric acid or sulphuric acid), water and alkali salts (sodium, potassium or lithium).

The weight percentage for the solution for the sol gel coating/film are:

alkanol: preferably from about 20 to 80 wt. % and more preferably from about 30 to 50 wt. %;

organosol: preferably from about 20 to 80 wt. % and more preferably from about 30 to 50 wt. %;

acid: preferably from about 0.00001 to 0.1 wt. % and more preferably from about 0.0001 to 0.01 wt. %;

water: preferably from about 10 to 80 wt. % and more preferably from about 20 to 50 wt. %; and alkali salts: preferably from about 0 to 5 wt. % and more preferably from about 0 to 2 wt. %.

The sol gel coating/film 224 on second wafer 216 is then dried or tempered at temperatures ranging from room temperature to temperatures below or equal to the bonding temperature, i.e. preferably from about 25 to 400° C.

The amorphous film 222' and sol gel coating/film 224 on second wafer 216 are then conditioned using a chemical cleaning solution bath comprised of preferably sulphuric- or hydrogen-peroxide-based RCA solutions at a temperature of preferably from about 50 to 80° C. for preferably from about 2 to 20 minutes. This causes the upper and lower surfaces of second wafer 216 to become hydrophilic.

Figure 21:
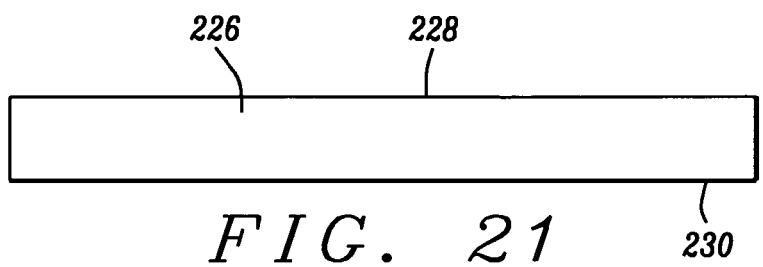

Conditioning of Third (Glass) Wafer 226—FIG. 21

As shown in FIG. 21, a third wafer 226 is polished on both its upper 228 and lower 230 surfaces so as to have mirror finishes. Third wafer 226 is preferably glass or glass with alkaline ions.

Third wafer 226 is then cleaned with a cleaning solvent that is preferably sulphuric- or hydrogen-peroxide-based RCA solutions.

Figure 22:
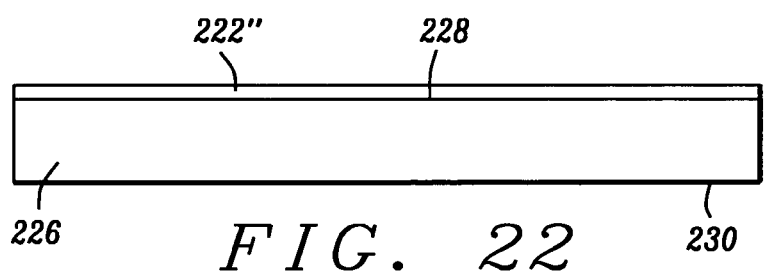

Formation of Amorphous Film 222" on Third Wafer 226—FIG. 22

As shown in FIG. 22, a hydrogen-free amorphous film 222" is formed on one polished surface 228 of third wafer 226 by physical vapor deposition (PVD) in plasma to a thickness of preferably from about 10 nm to 10 μm. and more preferably from about 10 to 100 nm. During the PVD of amorphous film 222", neither hydrogen nor any hydrogen-containing gas is introduced.

The physical vapor deposition (PVD) of amorphous film 222" is achieved preferably by laser ablation, evaporation, ion beam deposition or sputtering.

Amorphous film 222" is preferably comprised of silicon, silicon oxide or silicon nitride.

Third wafer 226 with amorphous film 222" is then conditioned in a chemical cleaning solution bath comprised of preferably sulphuric- or hydrogen-peroxide-based RCA solutions at a temperature of preferably from about 50 to 80° C. for preferably from about 2 to 20 minutes.

Figure 23:
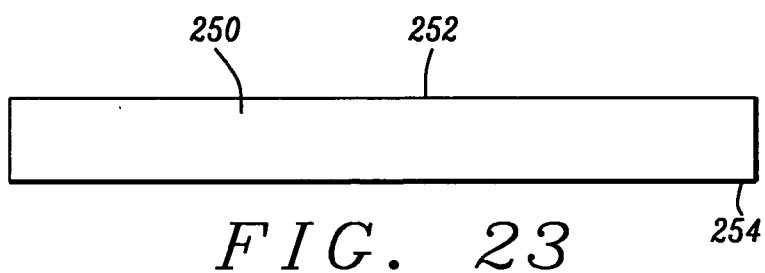

Conditioning of Fourth (Glass) Wafer 250—FIG. 23

As shown in FIG. 23, a fourth wafer 250 is conditioned in a chemical cleaning solution bath comprised of preferably sulphuric- or hydrogen-peroxide-based RCA solutions at a temperature of preferably from about 50 to 80° C. for preferably from about 2 to 20 minutes. This causes the upper and lower surfaces 252, 254 of third wafer 250 to become hydrophilic.

Fourth wafer 250 is preferably glass or glass with alkaline ions.

Figure 24:
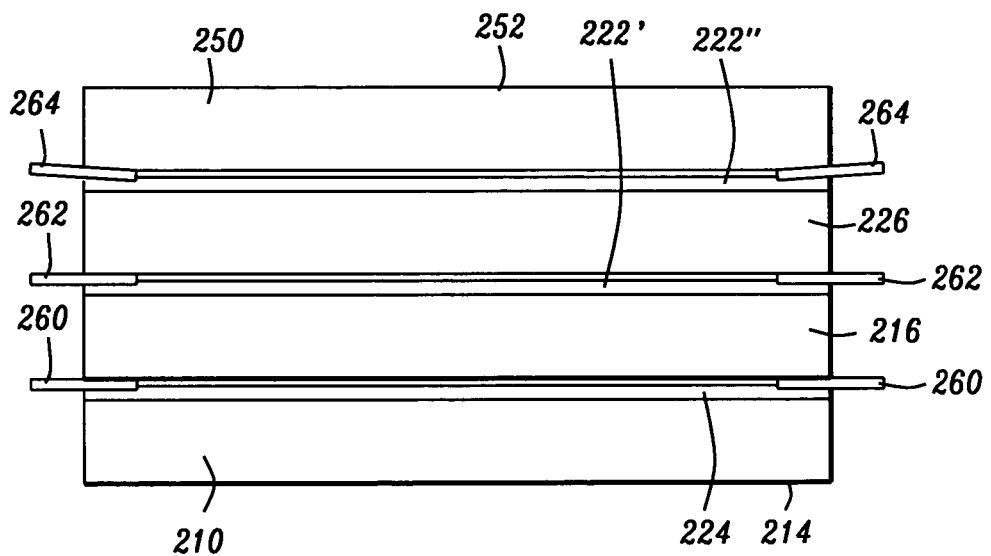

Stacking of First, Second, Third and Fourth Wafers 210, 216, 226, 250 With Spacers 260, 262, 264—FIG. 24

As shown in FIG. 24, second wafer 216 is positioned on top of, and spaced apart from, first wafer 210 using spacers 260 with the sol gel film 224 coated surface 220 facing first wafer 210.

Third wafer 226 is positioned on top of, and spaced apart from, second wafer 216 using spacers 262 with the PVD hydrogen-free amorphous film 222' coated surface 218 facing lower surface 230 of third wafer 226.

Fourth wafer 250 is positioned on top of, and spaced apart from, third wafer 226 using spacers 264 with the PVD hydrogen-free amorphous film 222" coated surface 228 of third wafer 226 facing fourth wafer 250.

Spacers 260, 262, 264 are placed at the edges of first, second, third and fourth wafers 210, 216, 226, 250, respectively, once the first, second and third wafers 210, 216, 226, 250 are properly aligned. Spacers 260, 262, 264 have a thickness of preferably from about 20 to 50 μm.

After stacking and alignment, the wafers are heated to temperatures preferably between 200° C. and 400° C. and more preferably less than about 300° C. in a vacuum chamber.

Figure 25:
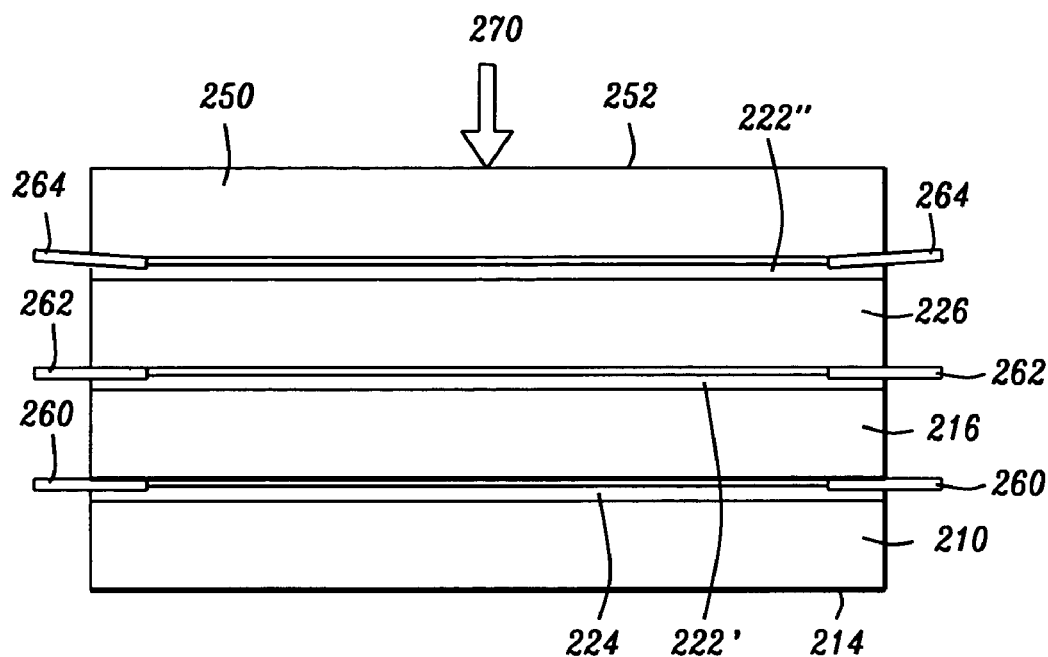

Bringing First, Second, Third and Fourth Wafers 210, 216, 226, 250 into Point Contact—FIG. 25

As shown in FIG. 25, the first, second, third and fourth wafers 210, 216, 226, 250 are brought into contact in their respective central areas under pressure. 270 of preferably from about 0.001 to 100 N/m².

Figure 26:
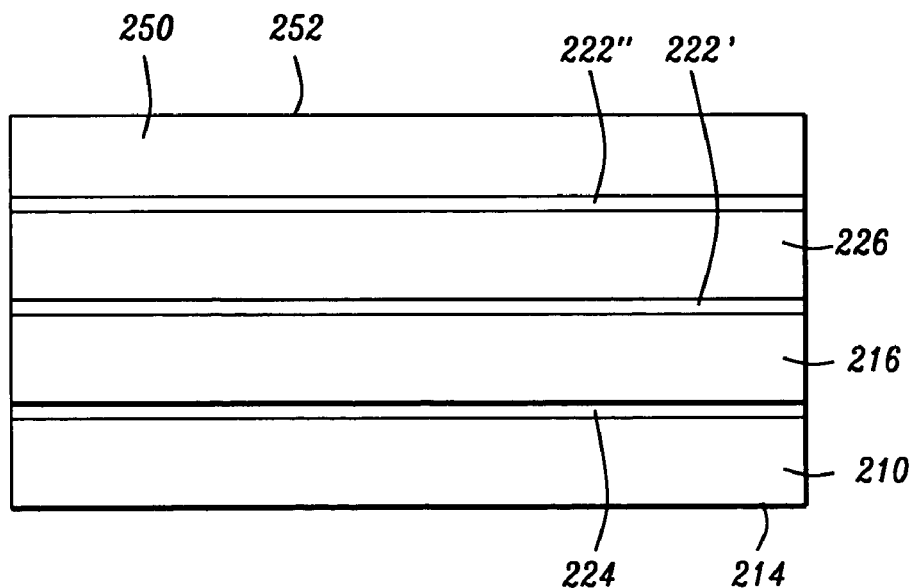

The spacers 260, 262, 264 are then removed (see FIG. 26).

Simultaneous Anodic Bonding of First, Second, Third and Fourth Wafers 210, 216, 226, 250—FIG. 26

As shown in FIG. 26, with the spacers 260, 262, 264 removed, the first, second, third and fourth wafers 210, 216, 226, 250 are simultaneously anodically bonded at a temperature of preferably from about 200 to 400° C. and more preferably less than about 300° C. at voltages of preferably from about 100 to 1000 volts.

Summary—FIGS. 27 to 29

FIGS. 27 to 29 summarize the present invention.

FIG. 27 shows a first silicon wafer 302 bonded to a second glass substrate 304 using amorphous silicon 306 in accordance with the method of the present invention.

FIG. 28 shows a first glass substrate 308 bonded to a second glass substrate 310 also using amorphous silicon 312 in accordance with the method of the present invention.

FIG. 29 shows a first silicon wafer 314 bonded to a second silicon wafer 316 using sol gel 318 in accordance with the method of the present invention.

As one skilled in the art would recognize, more than four components may be simultaneously anodically bonded in accordance with the teachings of the present invention.

The method of the present invention may by used with/in the following applications/fields of use and market potential, for example:

micro electromechanical system (MEMS) packaging;
micro optoelectromechanical system (MOEMS) packaging;
microfluidic and Bio-MEMS;
semiconductors;
microelectronics;
3D IC device fabrication;
optoelectronics;
substrate fabrication;
hermetic and vacuum sealing; and
encapsulation.

Advantages of the Present Invention

The advantages of one or more embodiments of the present invention include:
1. reduction in the bonding temperature, i.e. less than about 300° C., resulting in lower strain and lower residual stress;
2. greater choice of materials for bonding;
3. may simultaneously bond multiple wafers/substrates;
4. pre-fabricated devices and integrated circuitry formed in accordance with the present invention are not easily degraded or damaged;
5. bonding-induced stress problems after cooling are minimized;
6. the bonding time is shortened and the production efficiency is increased;
7. the method of the present invention is applicable for hermetic and vacuum sealing at low temperature (less than about 300° C.);
8. the process costs are reduced;
9. good bonding quality such as high bonding strength and bubble-free interfaces; and
10. cost effective process.

While particular embodiments of the present invention have been illustrated and described, it is not intended to limit the invention, except as defined by the following claims.

We claim:

1. A method of simultaneously bonding components, comprising the steps of:
providing at least first, second and third components; at least one of the first, second and third components being comprised of a glass substrate and at least one of the first, second and third components being comprised of a conductive or semiconductive material; each of the at least first, second and third components having an upper and lower surface;
determining the order of stacking of the at least first, second and third components to establish interfaces between adjacent at least first, second and third components;
applying a hydrogen-free amorphous film to one of the component surfaces at each interface comprising an adjacent:
glass component; and
conductive or semiconductive component;
applying a sol gel with or without alkaline ions film to one of the component surfaces at each interface comprising an adjacent:
conductive or semiconductive component; and
conductive or semiconductive component; and
simultaneously anodically bonding the at least first, second and third components in the determined order of stacking.

2. The method of claim 1, wherein the simultaneous anodic bonding of the at least first, second and third components is performed at a temperature of from about 200 to 400° C. and an applied voltage of from about 100 to 1000 volts.

3. The method of claim 1, wherein the simultaneous anodic bonding of the at least first, second and third components is performed at a temperature of less than about 300° C.

4. The method of claim 1, wherein the sol gel with or without alkaline ions film is applied to the interface surface of the conductive or semiconductive components; and the hydrogen-free amorphous films are applied to the interface surface of either the:
conductive or semiconductive components; or
glass components.

5. The method of claim 1, wherein the hydrogen-free amorphous films are applied by physical vapor deposition; and the sol gel with or without alkaline ions films are applied by spin-on, immersion or spraying.

6. The method of claim 1, wherein the hydrogen-free amorphous films are applied by physical vapor deposition achieved by laser ablation, evaporation, ion beam deposition or sputtering.

7. The method of claim 1, wherein the hydrogen-free amorphous films are comprised of silicon, silicon oxide or silicon nitride.

8. The method of claim 1, wherein the sol gel with or without alkaline ions films are formed from a solution comprised of:
methyltrimethoxysilane (MTMS);
methyltriethoxysilane (MTEOS);
tetraethylorthosilicate (TEOS);
phenyltrimethoxysilane (PhTMS);
methacryloxypropyltrimethoxysilane (MEMO);
(3-glycidoxypropyl)trimethoxysilane (GLYMO);
3-methoxypropyltrimethoxysilane (MeOPrTMS) or mixtures thereof;
an acid such as acetic acid hydrochloric acid or sulphuric acid;
water; and
alkali salts such as sodium, potassium or lithium.

9. The method of claim 1, wherein the sol gel with or without alkaline ions films each have a thickness of from about 10 nm to 10 µm.

10. The method of claim 1, wherein the sol gel with or without alkaline ions films each have a thickness of from about 10 to 100 nm.

11. The method of claim 1, wherein the components are cleaned and treated to render their upper and lower surfaces hydrophilic before application of the hydrogen-free amorphous films and the sol gel with or without alkaline ions films.

12. The method of claim 1, wherein the at least one of the first, second and third components being comprised of a glass substrate also includes alkaline ions.

13. The method of claim 1, wherein the components are cleaned and treated to render their upper and lower surfaces hydrophilic before bonding the at least first, second and third components.

14. The method of claim 1, wherein the at least first, second and third components are spaced apart using spacers just before the simultaneous anodically bonding step.

15. The method of claim 1, wherein the simultaneously bonded components are employed in a semiconductor device, an electronic device, a microelectromechanical system or a micro-optoelectromechanical system.

16. A method of simultaneously bonding components, comprising the steps of:
providing at least first, second and third components; at least one of the first, second and third components being comprised of a glass substrate and at least one of the first, second and third components being comprised of a conductive or semiconductive material; each of the at least first, second and third components having an upper and lower surface;
determining the order of stacking of the at least first, second and third components to establish interfaces between adjacent at least first, second and third components;
applying a hydrogen-free amorphous film to one of the component surfaces at each interface comprising an adjacent:
glass component; and
conductive or semiconductive component;
applying a sol gel with or without alkaline ions film to one of the component surfaces at each interface comprising an adjacent:
conductive or semiconductive component; and
conductive or semiconductive component; and
simultaneously anodically bonding the at least first, second and third components in the determined order of stacking at a temperature of from about 200 to 400° C.

17. The method of claim 16, wherein the simultaneous anodic bonding of the at least first, second and third components is performed at an applied voltage of from about 100 to 1000 volts.

18. The method of claim 16, wherein the simultaneous anodic bonding of the at least first, second and third components is performed at a temperature of less than about 300° C.

19. The method of claim 16, wherein the sol gel with or without alkaline ions film is applied to the interface surface of the conductive or semiconductive components; and the hydrogen-free amorphous films are applied to the interface surface of either the:
conductive or semiconductive components; or
glass components.

20. The method of claim 16, wherein the hydrogen-free amorphous films are applied by physical vapor deposition; and the sol gel with or without alkaline ions films are applied by spin-on, immersion or spraying.

21. The method of claim 16, wherein the hydrogen-free amorphous films are applied by physical vapor deposition achieved by laser ablation, evaporation, ion beam deposition or sputtering.

22. The method of claim 16, wherein the hydrogen-free amorphous films are comprised of silicon, silicon oxide or silicon nitride.

23. The method of claim 16, wherein the sol gel with or without alkaline ions films are formed from a solution comprised of:
methyltrimethoxysilane (MTMS);
methyltriethoxysilane (MTEOS);
tetraethylorthosilicate (TEOS);
phenyltrimethoxysilane (PhTMS);
methacryloxypropyltrimethoxysilane (MEMO);
(3-glycidoxypropyl)trimethoxysilane (GLYMO);
3-methoxypropyltrimethoxysilane (MeOPrTMS) or mixtures thereof;
an acid such as acetic acid, hydrochloric acid or sulphuric acid;
water; and
alkali salts such as sodium, potassium or lithium.

24. The method of claim 16, wherein the sol gel with or without alkaline ions films each have a thickness of from about 10 nm to 10 μm.

25. The method of claim 16, wherein the sol gel with or without alkaline ions films each have a thickness of from about 10 to 100 nm.

26. The method of claim 16, wherein the components are cleaned and treated to render their upper and lower surfaces hydrophilic before application of the hydrogen-free amorphous films and the sol gel with or without alkaline ions films.

27. The method of claim 16, wherein the at least one of the first, second and third components being comprised of a glass substrate also includes alkaline ions.

28. The method of claim 16, wherein the components are cleaned and treated to render their upper and lower surfaces hydrophilic before bonding the at least first, second and third components.

29. The method of claim 16, wherein the at least first, second and third components are spaced apart using spacers just before the simultaneous anodically bonding step.

30. The method of claim 16, wherein the simultaneously bonded components are employed in a semiconductor device, an electronic device, a microelectromechanical system or a micro-optoelectromechanical system.

31. A method of simultaneously bonding components, comprising the steps of:
providing at least first, second and third components; at least one of the first, second and third components being comprised of a glass substrate and at least one of the first, second and third components being comprised of a conductive or semiconductive material; each of the at least first, second and third components having an upper and lower surface;
determining the order of stacking of the at least first, second and third components to establish interfaces between adjacent at least first, second and third components;
applying a hydrogen-free amorphous film to one of the component surfaces at each interface comprising an adjacent:
glass component; and
conductive or semiconductive component;
applying a sol gel with or without alkaline ions film to one of the component surfaces at each interface comprising an adjacent:
conductive or semiconductive component; and
conductive or semiconductive component;
heating the at least first, second and third components;
bringing the at least first, second and third components into contact in the determined order of stacking; and applying a voltage to the at least first, second and third components to simultaneously bond the at least first, second and third components.

32. The method of claim 31, wherein the heating the at least first, second and third components is performed within a vacuum chamber at a temperature of from about 200 to 400° C.

33. The method of claim 31, wherein the heating the at least first, second and third components is performed within a vacuum chamber at a temperature of less than about 400° C.

* * * * *